United States Patent
Zhu et al.

(10) Patent No.: US 9,741,734 B2
(45) Date of Patent: Aug. 22, 2017

(54) MEMORY DEVICES AND SYSTEMS HAVING REDUCED BIT LINE TO DRAIN SELECT GATE SHORTING AND ASSOCIATED METHODS

(71) Applicant: Intel Corporation, Santa Clara, CA (US)

(72) Inventors: Hongbin Zhu, Boise, ID (US); Jun Zhao, Boise, ID (US); Purnima Narayanan, Boise, ID (US); Gordon Haller, Boise, ID (US); Damir Fazil, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/970,288

(22) Filed: Dec. 15, 2015

(65) Prior Publication Data

US 2017/0170190 A1    Jun. 15, 2017

(51) Int. Cl.

| | |
|---|---|
| *H01L 27/11582* | (2017.01) |
| *H01L 27/1157* | (2017.01) |
| *H01L 21/768* | (2006.01) |
| *G11C 16/04* | (2006.01) |
| *G11C 16/08* | (2006.01) |
| *G11C 16/26* | (2006.01) |
| *G11C 16/24* | (2006.01) |
| *G11C 16/10* | (2006.01) |

(52) U.S. Cl.
CPC .... *H01L 27/11582* (2013.01); *G11C 16/0483* (2013.01); *G11C 16/08* (2013.01); *G11C 16/10* (2013.01); *G11C 16/24* (2013.01); *G11C 16/26* (2013.01); *H01L 21/76802* (2013.01); *H01L 21/76877* (2013.01); *H01L 21/76897* (2013.01); *H01L 27/1157* (2013.01)

(58) Field of Classification Search
CPC ................................................. H01L 27/10888
USPC ......................................................... 438/652
See application file for complete search history.

(56) References Cited

U.S. PATENT DOCUMENTS

| | | | | |
|---|---|---|---|---|
| 2009/0315103 | A1* | 12/2009 | Hsieh ................... | H01L 29/0878 257/330 |
| 2010/0327338 | A1* | 12/2010 | Yaegashi ........... | H01L 21/28273 257/314 |
| 2011/0057251 | A1* | 3/2011 | Higashi ............. | H01L 27/11578 257/324 |
| 2013/0089974 | A1 | 4/2013 | Lee et al. | |
| 2013/0119545 | A1* | 5/2013 | Lee ................... | H01L 27/10888 257/751 |
| 2014/0071756 | A1* | 3/2014 | Iwai ..................... | H01L 27/1157 365/185.11 |

(Continued)

OTHER PUBLICATIONS

Knotter et al.; "Etching mechanism of silicon nitride in HF-based solutions"; Journal of the Electrochemical Society, Electrochemical Society, Inc.; (Mar. 1, 2001); p. F43-F46; vol. 148(3).

(Continued)

*Primary Examiner* — Min Huang
(74) *Attorney, Agent, or Firm* — Thorpe North and Western, LLP; David W. Osborne

(57) ABSTRACT

3D NAND memory devices and systems having reduced bit line to drain select gate shorting, including associated methods, are provided and described.

12 Claims, 8 Drawing Sheets

(56) References Cited

U.S. PATENT DOCUMENTS

2014/0110851 A1* 4/2014 Kim ................. H01L 27/10885
                                                      257/773
2015/0270282 A1   9/2015 Koshiishi et al.
2016/0189770 A1* 6/2016 Abe .................... G11C 11/5642
                                                      365/185.03

OTHER PUBLICATIONS

PCT Search Report for application No. PCT/US2016/062273; dated Apr. 7, 2017; 17 pages.

* cited by examiner

MEMORY DEVICES AND SYSTEMS HAVING REDUCED BIT LINE TO DRAIN SELECT GATE SHORTING AND ASSOCIATED METHODS

BACKGROUND

Memory structures are integrated circuits that provide data storage to a variety of electronics devices. Memory can include volatile memory structures that lose stored information when not powered (e.g., RAM-Random Access Memory), and non-volatile memory structures that retain stored information even when not powered. One example of such non-volatile memory is flash memory. Non-volatile flash memory can be used in a variety of portable devices, and can be beneficial for use when transferring data from one electronic device to another where power is not supplied during the physical transfer.

DESCRIPTION OF EMBODIMENTS

Figure 1:
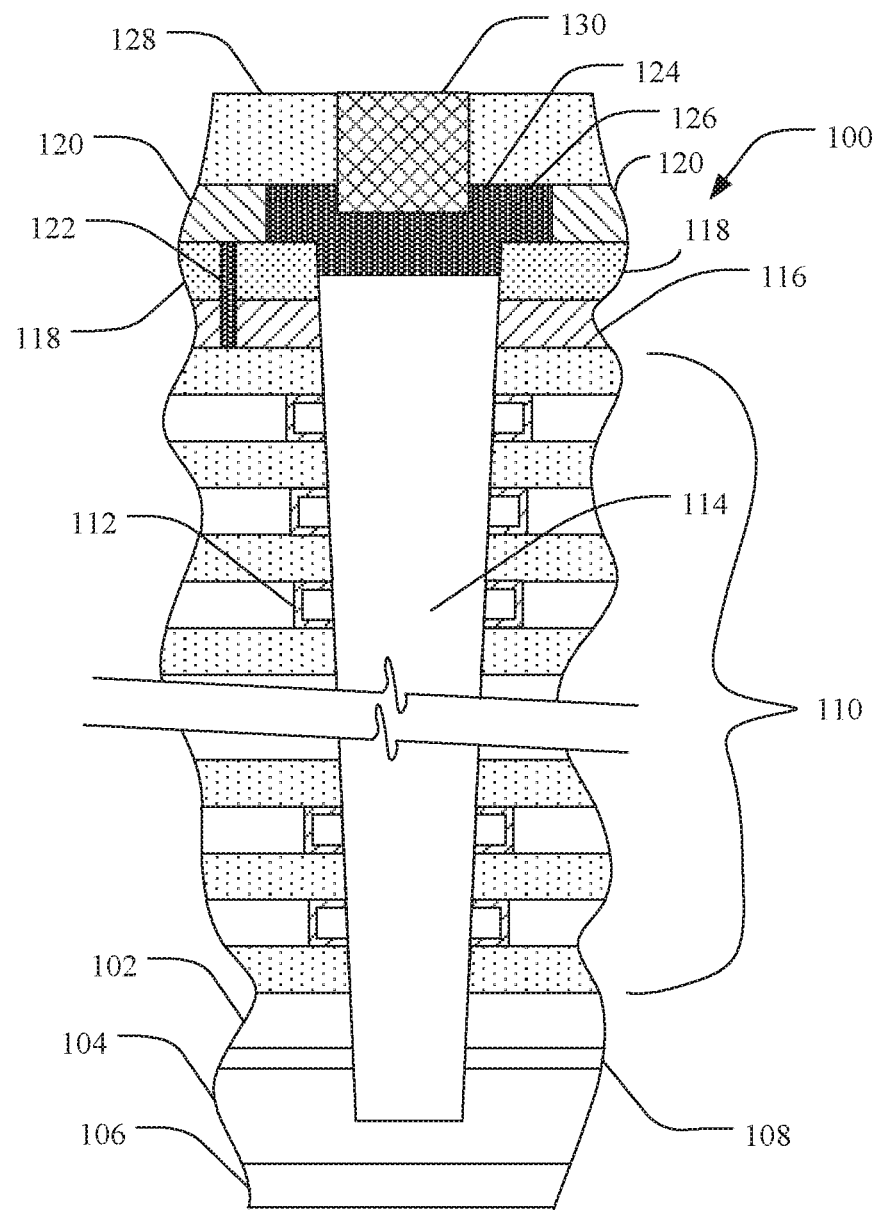
FIG. 1 is a cross-sectional view of an exemplary 3D NAND memory device.

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," in this specification it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, "coupled" refers to a relationship of connection or attachment between one item and another item, and includes relationships of either direct or indirect connection or attachment. Any number of items can be coupled, such as materials, components, structures, layers, devices, objects, etc. Coupling can include physical coupling, electrical coupling, thermal coupling, functional coupling, and the like.

As used herein, "directly coupled" refers to a relationship of physical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

The present subject matter pertains to flash memory, such as three dimensional (3D) flash memory array devices, systems, and associated methods. Flash memory is a memory technology that utilizes a plurality of memory cells arranged in some form of an array, where each memory cell is capable of storing binary data. A typical memory cell resembles a field-effect transistor (FET) having a conductive floating (i.e. electrically isolated) gate that controls the electrical conduction of a charge carrier channel between the source and drain regions of the memory cell. More specifically, the floating gate is positioned between the control gate and the channel of a metal-oxide silicon FET (MOSFET), and a non-conductive material (e.g. a nitride) facilitates charge storage between the control gate and the charge carrier channel. The stored data is represented by the amount of charge on the floating gate, and as such, the electrical resistance between the source and the drain can be used to read the binary value stored in the floating gate.

One example of a flash architecture is NAND flash, which in general comprises multiple memory cells connected in an arrangement similar to a NAND gate. In one embodiment, a group or string of memory cells are connected in series, source to drain, such that each control gate is coupled to a word line (WL). Select gates can couple the string of memory cells to a source line at one end and to a bit line (BL) at the other end. In one example of a 3D flash array, multiple strings of memory cells can be arranged around a conductive pillar, such that in each string of memory cells, the source, channel, and drain are arranged along the length of the pillar. In one architectural arrangement, these vertical NAND strings can be coupled at the bottom end to a source line via a source select gate (SGS), and at the top end to a BL via a drain select gate (SGD).

One potential defect when manufacturing such a memory device is a short that can arise as a result of the formation of the contact between the BL and the SGD. In one embodiment, the presently describe approach provides a self-stop that blocks BL-SGD shorting, in part through the use of a nitride/oxide film stack as an in situ etch mask over the SGD. At least a portion of the oxide is preserved through the punch process, which can serve as a second mask layer. During subsequent processing, the nitride/oxide stacked configuration forms a stair-like depression when wet etched. When the depression is filled, a T plug, such as a T polysilicon or T poly plug is formed. This T poly plug thus protects the interface between the SGD and the conductive pillar at least during the formation of the contact between the BL and the SGD.

It is noted that, while the specification describes mostly monolithic flow designs, the disclosed technology extends to baseline flows as well, and as such, monolithic, baseline, or any other potential memory design is considered to be within the present scope.

As is shown in FIG. 1, for example, one embodiment of a memory device 100 can include a SGS layer 102 disposed on a source layer 104, which is in turn disposed on a substrate layer 106. In some embodiments, a source-insulating layer 108 can be positioned between the SGS layer 102 and the source layer 104. The source layer 104, with or without the source-insulating layer 108, can be referred to as the contact region, upon which the SGS layer is disposed. A tiered stack of semiconductor layers (tiered stack) 110 is disposed on the SGS layer 102.

The substrate layer 106 can include one or more layers, and can be a substrate with a primarily a supportive purpose, or a more complex structure, such as a substrate having metallization lines therein, metallization lines themselves, an underlying memory array, doped regions, and the like. In one specific embodiment, the substrate can be a silicon wafer or layer. In another specific embodiment, the substrate can be an oxide layer, a nitride layer, a combination of oxide and nitride in a layer, or the like. The source layer 104 can be a layer comprised of any useful conductive material, such as a semiconductor, metal, or the like, including combinations and mixtures thereof. In one embodiment, the source layer 104 can comprise a doped or heavily doped silicon, such as, for example, polysilicon. In another embodiment, the source layer 104 can comprise a silicide, including salicides, polycides, or the like. In one specific embodiment, the source layer 104 can comprise WSix. The source layer 104 can additionally be a layer of conductive and nonconductive regions forming source lines of a memory array.

As has been described, the SGS layer 102 can be a MOSFET select gate coupling the source layer 104 to a plurality of charge storage devices 112 within the tiered stack 110. The SGS layer 102 can be electrically isolated from the source layer 104 by the source-insulating layer 108, as described above. Any material capable of electrically insulating between two material layers and that is capable of being utilized in a memory device is considered to be within the present scope. Non-limiting examples can include, however, an oxide layer, a nitride layer, a combination of oxide and nitride in a layer, or the like, for the insulating layer 108 as well as any other insulating layers in the device where appropriate.

Returning to FIG. 1, the memory device can additionally include a pillar or channel 114 extending at least from the source layer 104 through the SGS layer 102 and the tiered stack 110. In some embodiments, the pillar 114 can be comprised of any suitable conductor or semiconductor material, which can include a single or multiple different materials. Non-limiting examples can include silicon, polysilicon, gallium, gallium arsenide, and the like, including combinations thereof. In some embodiments, the pillar material can comprise a semiconductor material. In other embodiments, the semiconductor material can also be doped. In some embodiments, the pillar material can comprise a conductive metal, metal mixture, metal alloy, or the like. Additionally, in one embodiment the pillar can comprise an oxide material. In some cases, such an oxide material can be coated with a conductive or semiconductive channel layer. The pillar can be cylindrical or non-cylindrical. One example of a non-cylindrical pillar is the tapered pillar 114 shown in FIG. 1.

A SGD layer 116 is formed on the tiered stack 110 opposite the SGS layer 102, followed by one or more insulating layers. In the embodiment shown in FIG. 1, the insulating layers are shown as a nitride isolation layer 118 on the SGD layer 116 and an oxide isolation layer 120 disposed on the nitride isolation layer 118. In some embodiments, a dielectric barrier 122 can be formed in the nitride isolation layer 118, the SGD layer 116, or both. The SGD layer 116 can comprise a MOSFET select gate coupling the plurality of charge storage devices 110 to the BL (not shown).

A T-shaped plug, or T-plug 124 is formed on the pillar 114, and is positioned to protect the interface between the SGD layer and the conductive pillar during formation of the contact between the BL and the SGD layer. Further protection can be provided by an extended portion 126 or flange-like protuberance of the T-plug into a portion of the insulating material overlying the SGD layer 116. In the embodiment shown in FIG. 1, the extended portion 126 into the oxide isolation layer 120 and over a portion of an upper surface of the nitride isolation layer 118 around the edge of the pillar 114. The T-plug can comprise any number of materials, and any material capable of protecting the SGD layer 116 from the formation of shorts to the BL that is compatible with such a memory device is considered to be within the present scope. In one embodiment, the T-plug can comprise a semiconductor material, and can be referred to as a semiconductor plug. Non-limiting examples can include silicon, polysilicon, gallium, gallium arsenide, and the like, including combinations thereof. In one specific embodiment, the T-plug can comprise polysilicon. While the T-plug can be un-doped, in some embodiments the T-plug can be doped or heavily doped. Furthermore, the T-plug can comprise a material that is the same as the pillar 114, or that is different from the pillar 114. In one embodiment, for example, both the T-plug and the pillar, or at least a channel of the pillar, can be doped. For example, the T-plug can be n-type and the pillar can be p-type, or vice versa.

A topcoat or cap layer 128 can be disposed across the T-plug 124 and the oxide isolation layer 120, and a BL contact 130 positioned over, and in some embodiments into, the T-plug 124. The BL contact 130 thus provides electrical connection from the plurality of charge storage devices 112 through the pillar 114 and to the BL. It is noted that the pillar 114 can include various layers, channels, and the like, which are not shown in FIG. 1 for clarity. Additionally, in one embodiment, the cap layer 128 can be an oxide layer.

Figure 2:
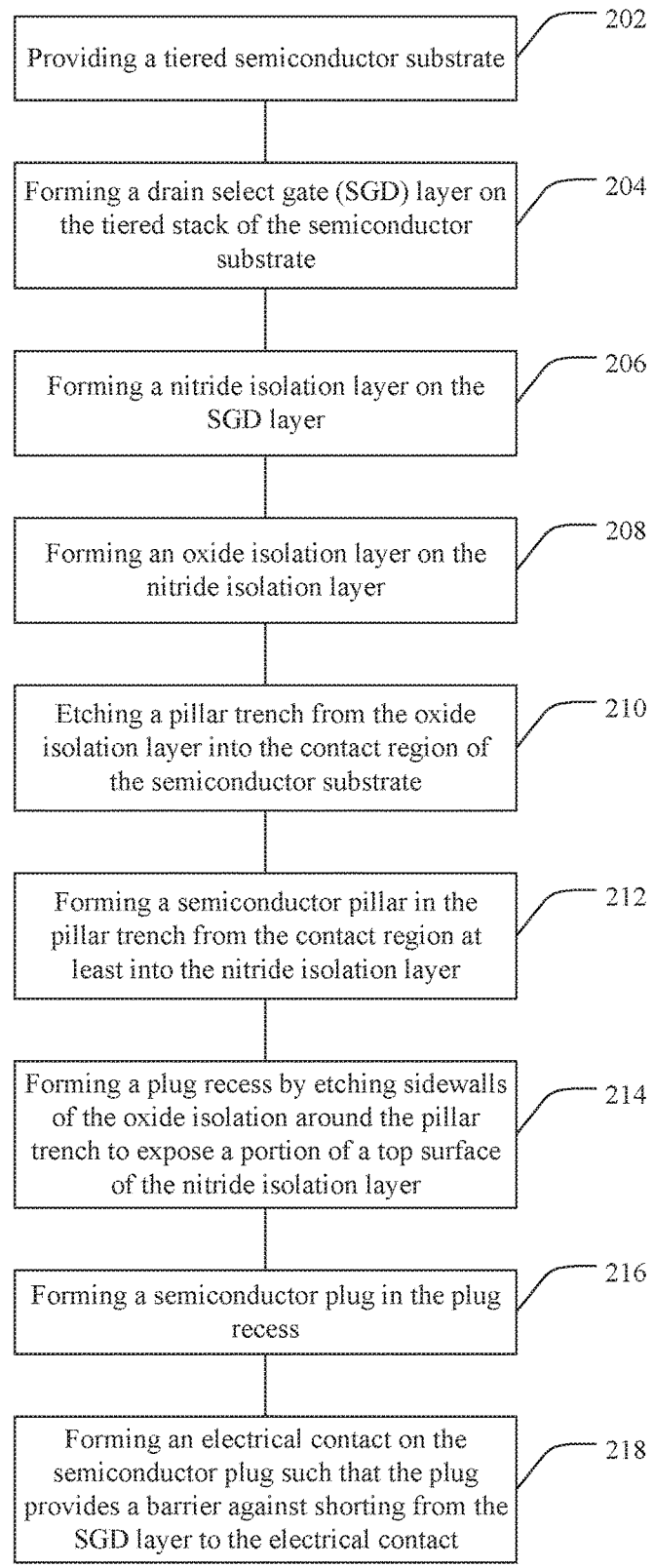
FIG. 2 is a diagram of method steps for making an exemplary 3D NAND memory device.

In another example embodiment, a method of forming a memory structure is provided, as is shown in FIG. 2. Such a method can comprise 202 providing a layered semiconductor substrate having a contact region, a SGS layer on the contact region, and a tiered stack of semiconductor layers on the SGS layer, 204 forming a SGD layer on the tiered stack of the semiconductor substrate, 206 forming a nitride isolation layer on the SGD layer, and 208 forming an oxide isolation layer on the nitride isolation layer. The method can further comprise 210 etching a pillar trench from the oxide isolation layer into the contact region of the semiconductor substrate, 212 forming a semiconductor pillar in the pillar trench from the contact region at least into the nitride isolation layer, 214 forming a plug recess by etching sidewalls of the oxide isolation around the pillar trench to expose a portion of a top surface of the nitride isolation layer, 216 forming a semiconductor plug in the plug recess, and 218 forming an electrical contact on the semiconductor plug such that the semiconductor plug provides a barrier against electrical shorting from the SGD layer to the electrical contact.

Figure 3A:
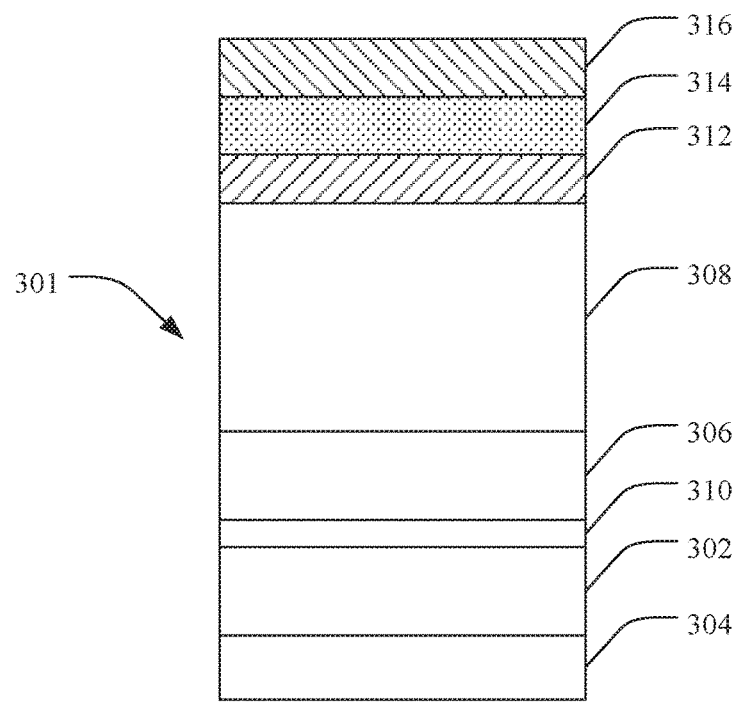
FIG. 3a is a cross-section view of an exemplary 3D NAND memory device during manufacture.

FIGS. 3a-i show a memory device at a series of points during the manufacturing process according to one invention embodiment. Unless otherwise noted, techniques for manufacturing the various structural elements of the memory device are well known, and would be readily apparent to one of ordinary skill in the art once in possession of the present specification. FIG. 3a shows a layered semiconductor substrate 301 including a source or contact region 302 disposed on a substrate 304, a SGS layer 306 on the source region 302, and a tiered stack of semiconductor layers 308 on the SGS layer 306, and in some cases a source insulating layer 310 between the SGS layer 306 and the source region 302. An SGD layer 312 is formed on the tiered stack of semiconductor layers 308, a nitride isolation layer 314 is formed on the SGD layer 312, and an oxide isolation layer 316 is formed on the nitride isolation layer 314.

Figure 3B:
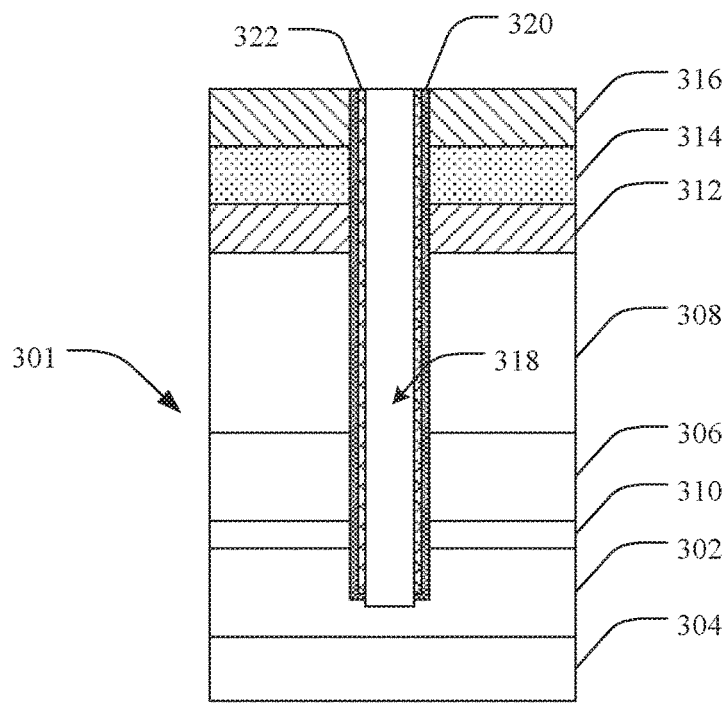
FIG. 3b is a cross-section view of an exemplary 3D NAND memory device during manufacture.
Figure 3C:
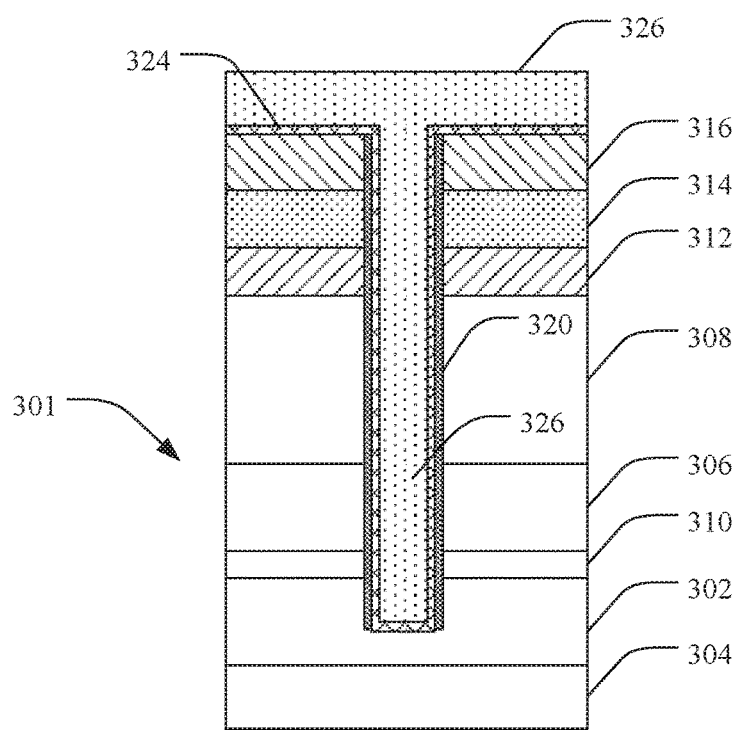
FIG. 3c is a cross-section view of an exemplary 3D NAND memory device during manufacture.
Figure 3D:
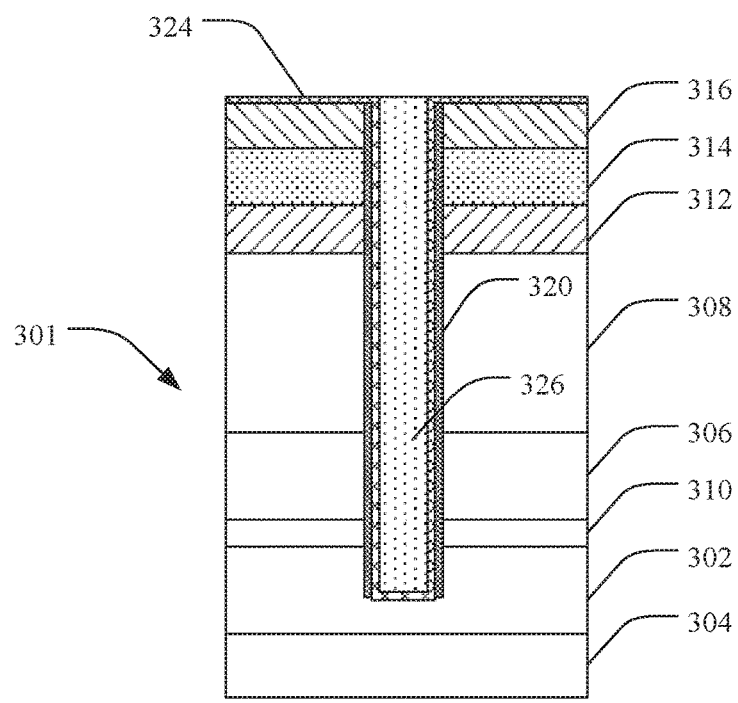
FIG. 3d is a cross-section view of an exemplary 3D NAND memory device during manufacture.

FIG. 3b shows a trench 318 etched into the structure of FIG. 3a, extending from the oxide isolation layer 316 into the source region 302. A trench oxide layer 320 is formed along the inside of the trench 318, and a sacrificial liner 322 is formed over the trench oxide layer 320 to protect the trench oxide during the punch etch process. Following the punch etch, the sacrificial liner 322 is removed to expose the trench oxide layer 320, and a doped hollow channel (DHC) layer 324 is applied over the trench oxide layer 320, as is shown in FIG. 3c. In some embodiments, the DHC layer material is applied over the upper surface of the oxide isolation layer 316. The trench 318 is filled with a material to form the central pillar 326 of the memory device. The central pillar can be formed to various levels in the trench depending on the specific process design and subsequent processing steps. In one embodiment, for example, the central pillar in the trench extends from within the contact region at least to the top surface of the nitride isolation layer. In another embodiment, the central pillar in the trench extends from within the contact region at least into the oxide isolation layer. In another embodiment, the central pillar extends from within the contact region onto a top surface of the oxide isolation layer. In some embodiments, the filler material (i.e. the trench fill material or central pillar material) is also applied over at least a portion of the upper surface of the oxide isolation layer 316, or in some cases, over the DHC layer material 324 coating the oxide isolation layer 316. While any useful material can be utilized as the filler material to form the pillar 326, in one specific aspect the filler material can be a spin-on-oxide (SOD) filler. FIG. 3d shows the structure with the filler material and central pillar 326 is removed to expose the DHC layer material 324 disposed on the oxide isolation layer 316.

Figure 3E:
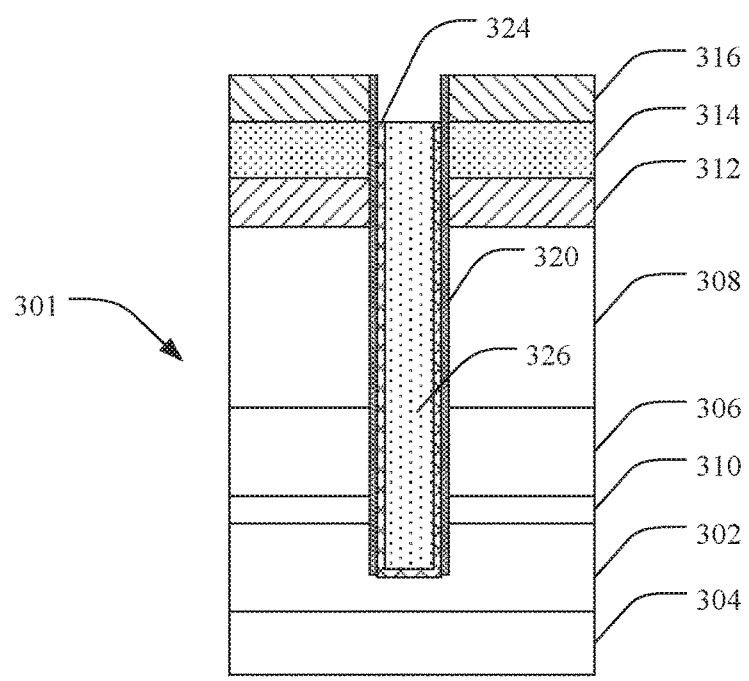
FIG. 3e is a cross-section view of an exemplary 3D NAND memory device during manufacture.
Figure 3F:
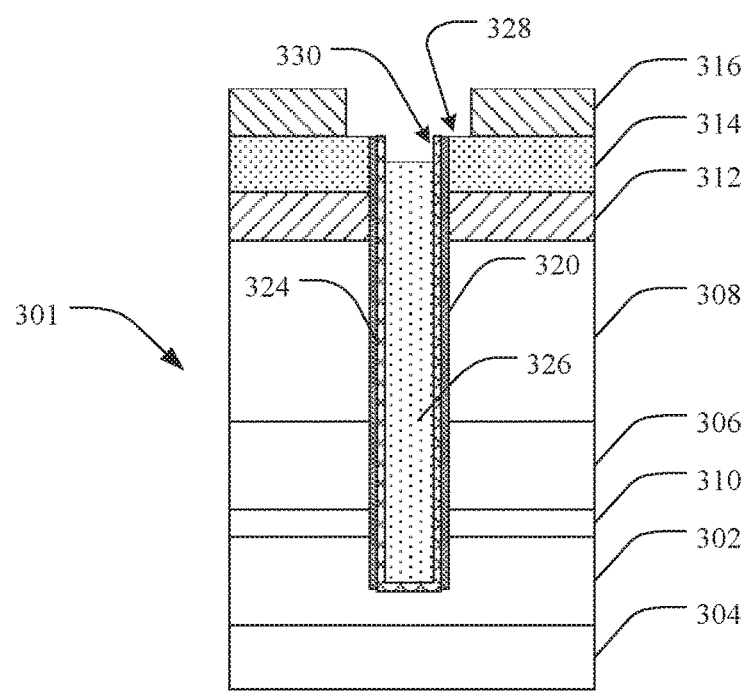
FIG. 3f is a cross-section view of an exemplary 3D NAND memory device during manufacture.

As is shown in FIG. 3e, the DHC layer material 324 is removed to expose the upper surface of the oxide isolation layer 316, and, along with the central pillar 326, is etched back to the interface between the oxide isolation layer 316 and the nitride isolation layer 314. A plug recess can then be formed by etching the sidewalls of the oxide isolation layer 316 around the central pillar 326 to expose a portion of the upper or top surface 328 of the nitride isolation layer 312, as is shown in FIG. 3f. Additionally, a portion 330 of the central pillar 326 is etched back to expose sidewalls 330 of the DHC layer material 324. Any known process for removing the oxide isolation layer and the central pillar is considered to be within the present scope. In some example embodiments, various wet or dry etching procedures can be utilized. In one example, a buffered oxide etch can be used. Buffered oxide etches generally comprise an acid, such as hydrofluoric acid, and a buffering agent, such as ammonium fluoride. Additionally, while various configurations for the plug recess are contemplated based on various design parameters, in one embodiment the depth of the central pillar recess is roughly equal to the distance of the oxide isolation etch. Thus, it may be beneficial to balance the lateral and vertical etch distances.

Figure 3G:
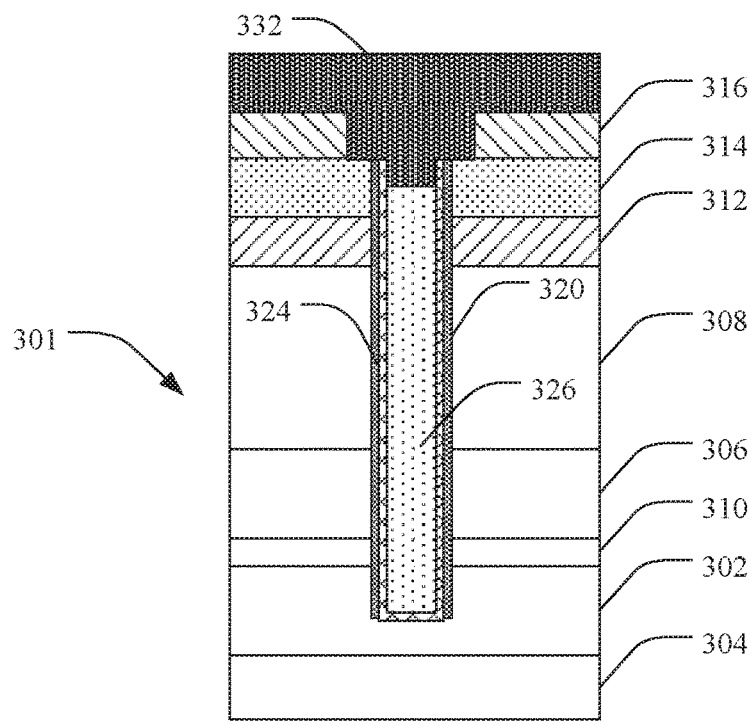
FIG. 3g is a cross-section view of an exemplary 3D NAND memory device during manufacture.
Figure 3H:
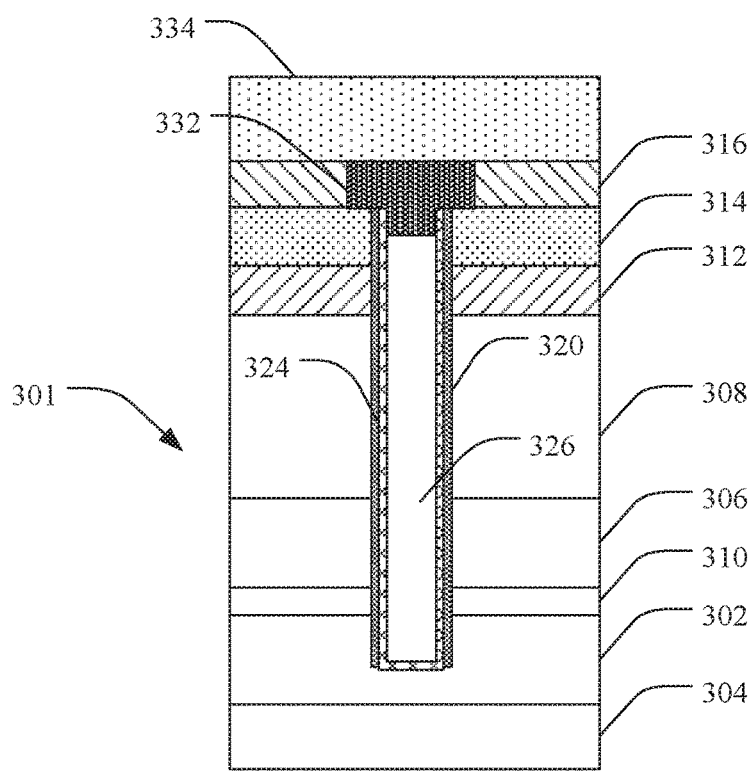
FIG. 3h is a cross-section view of an exemplary 3D NAND memory device during manufacture.

In one embodiment, the plug recess is filled with a plug material to form a T-plug 332, as is shown in FIG. 3g. Additionally, the plug material can be applied across the upper surface of the oxide isolation layer 316, which, among other things, can increase the integrity of the fill around the upper edges of the plug recess. The plug material present along the upper surface of the oxide isolation layer 316 can be removed, as is shown in FIG. 3h. The exposed surface of the oxide isolation layer 316 and the T-plug can then be used as a landing layer for a cap layer 334, such as, for example, an oxide cap layer. As described above, the plug material can be the same or different from the central pillar material, provided the material is at least capable of providing protection against BL to SGD layer shorts. Additionally, the T-plug 332 can be doped or undoped, depending on the design of the memory device.

Figure 3I:
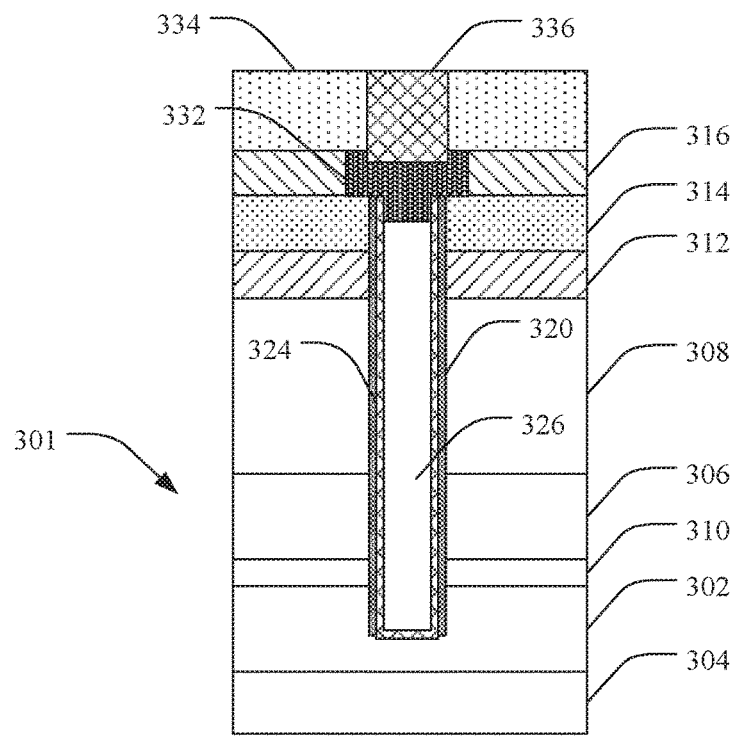
FIG. 3i is a cross-section view of an exemplary 3D NAND memory device during manufacture.
Figure 3J:
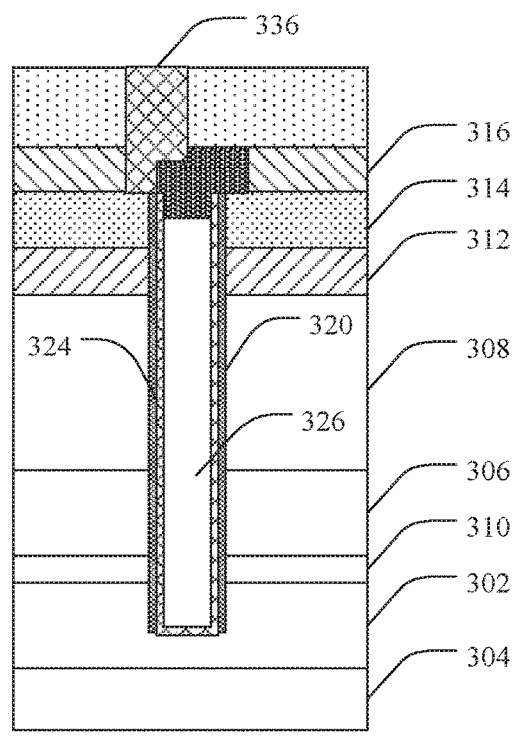
FIG. 3j is a cross-sectional view of a 3D NAND memory device with an off-center BL contact.

FIG. 3i shows an electrical or BL contact 336 formed on the T-plug 332, which can be formed before or after depositing the cap layer 334. The BL contact 336 provides an electrical coupling from the BL to the memory device. As can be seen in FIG. 3i the extended top surface of the T-plug 332 provides protection against shorts forming between BL and the SGD during BL contact formation, even for those situations where the BL contact is significantly off-center from the T-plug. For example, FIG. 3j shows an example of an off-center BL contact.

Embodiments can be utilized in any device or system having NAND memory. While any type or configuration of device or computing system is contemplated to be within the present scope, non-limiting examples can include laptop computers, CPU systems, tablet computers, smart phones, SoC systems, server systems, networking systems, storage systems, high capacity memory systems, or any other computational system.

Figure 4:
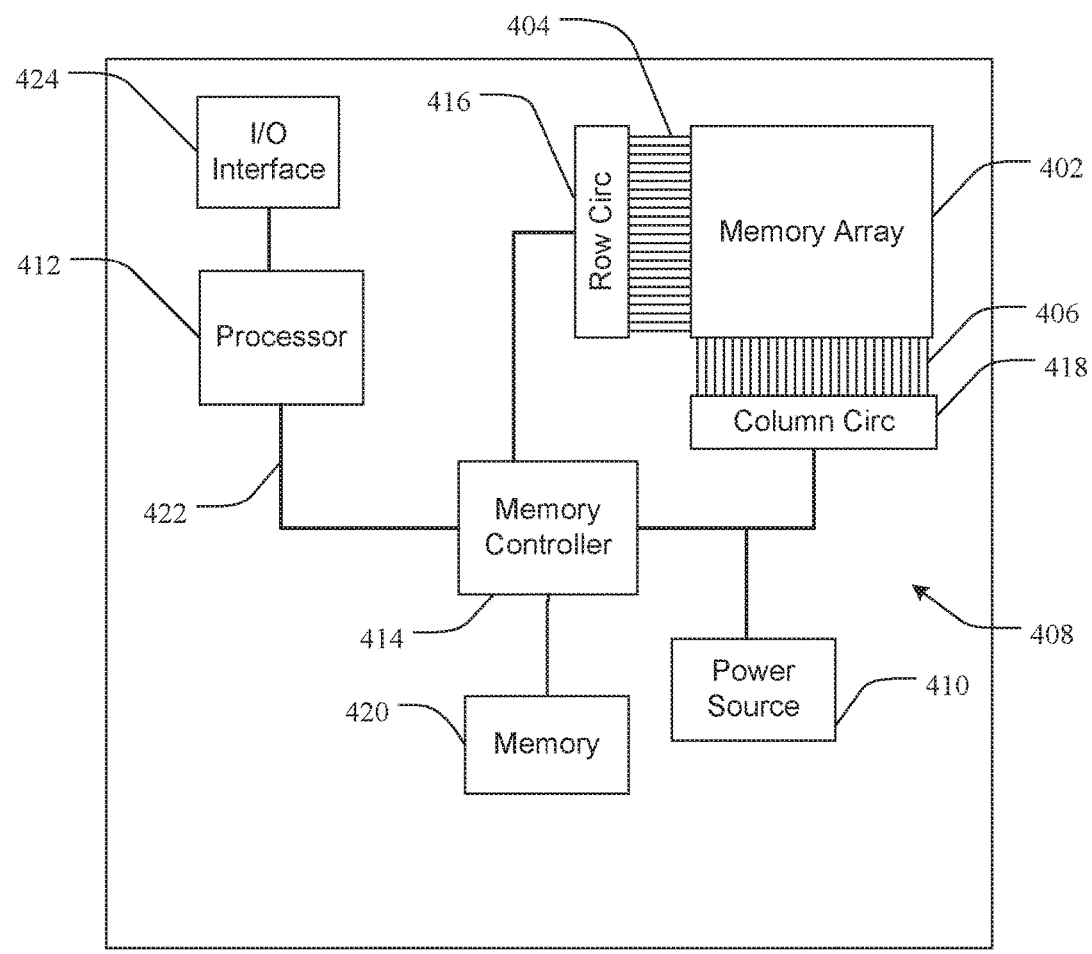
FIG. 4 is a schematic of an exemplary computing system.

One example of a computing system can comprise one or more of the memory devices as described having an array of charge storage devices arranged within the tiered stack of semiconductor layers and oriented along the central pillar. As is shown in FIG. 4, the one or more memory devices are collectively referred to as the memory array 402. A plurality of WLs 404 is coupled to groups of the charge storage devices across the array, and a plurality of BLs 406 is coupled to groups of charge storage devices across the array, such that each charge storage device is uniquely addressed in the array by a combination of a WL and a BL. The system can also include circuitry 408 electrically coupled to the memory devices and configured to perform a variety of functions, including generating memory control commands, addressing the charge storage devices in the array, and reading a state of each charge storage device, among others. The system can further comprise a power source 410 coupled to the circuitry, a processor 412, and a memory controller 414 configured to control read/write operations and addressing of the memory devices, and to communicate with the processor 412. The circuitry can also include row circuitry 416 coupled to the WLs 404 and column circuitry 418 coupled to the BLs 406, such that the column circuitry and the row circuitry are configured to address the plurality of charge storage devices in the memory array 402.

Furthermore, in one embodiment the system can further comprise additional memory 420 in addition to the memory array 402, where the additional memory 420 is coupled to the memory controller 414. The memory controller can be a distinct controller, integrated into the processor, or implemented into the system by any other appropriate technique. The additional memory 420 can comprise volatile and/or nonvolatile memory, and can further comprise any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The system can additionally include a local communication interface 422 for connectivity between the various components of the system. For example, the local communication interface can be a local data bus and/or any related address or control busses as may be desired.

The system can include an I/O interface 424 for controlling various I/O functions of the system, as well as for I/O connectivity to devices outside of the system. A network interface can also be included for network connectivity, either as a separate interface or as part of the I/O interface. The network interface can control network communications both within the system and outside of the system. The network interface can include a wired interface, a wireless interface, a Bluetooth interface, optical interface, and the like, including appropriate combinations thereof. Furthermore, the system can additionally include a user interface, a display device, as well as various other components that would be beneficial for such a system.

The processor 412 can be a single or multiple processors, and the memory 420 and the memory array 402 can be single or multiple memories. The local communication interface 422 can be used as a pathway to facilitate communication between any of a single processor, multiple processors, a single memory, multiple memories, the various interfaces, and the like, in any useful combination.

The additional memory 420 can refer to a volatile or nonvolatile memory device. In one embodiment, for example, a nonvolatile memory device is a block addressable memory device, such as NAND or NOR technologies. Thus, a memory device can also include a future generation nonvolatile devices, such as a three dimensional crosspoint memory device, or other byte addressable nonvolatile memory device. In one embodiment, the memory device can be or include multi-threshold level NAND flash memory or NOR flash memory.

The following examples pertain to specific embodiments and point out specific features, elements, or steps that can be used or otherwise combined in achieving such embodiments.

EXAMPLES

The following examples pertain to specific embodiments and point out specific features, elements, or steps that can be used or otherwise combined in achieving such embodiments.

In one example there is provided, a method of forming a memory structure, comprising:
providing a layered semiconductor substrate having a contact region, a source select gate (SGS) layer on the contact region, and a tiered stack of semiconductor layers on the SGS layer;
forming a drain select gate (SGD) layer on the tiered stack of the semiconductor substrate;
forming a nitride isolation layer on the SGD layer;
forming an oxide isolation layer on the nitride isolation layer;
etching a pillar trench from the oxide isolation layer into the contact region of the semiconductor substrate;
forming a central pillar in the pillar trench from the contact region at least into the nitride isolation layer;
forming a plug recess by etching sidewalls of the oxide isolation around the pillar trench to expose a portion of a top surface of the nitride isolation layer;
forming a T-plug in the plug recess; and
forming an electrical contact on the T-plug such that the T-plug provides a barrier against electrical shorting from the electrical contact to the SGD layer.

In one example of a method for forming a memory structure, forming the central pillar in the pillar trench extends from within the contact region at least to the top surface of the nitride isolation layer.

In one example of a method for forming a memory structure, forming the central pillar in the pillar trench extends from within the contact region at least into the oxide isolation layer.

In one example of a method for forming a memory structure, forming the central pillar in the pillar trench extends from within the contact region onto a top surface of the oxide isolation layer.

In one example of a method for forming a memory structure, forming the plug recess further comprises etching central pillar material from the top surface of the oxide isolation layer.

In one example of a method for forming a memory structure, forming the T-plug further comprises:
forming the T-plug in the plug recess and across a top surface of the oxide isolation layer; and
removing a portion of the T-plug to expose the top surface of the oxide isolation layer.

In one example of a method for forming a memory structure, the method further comprises forming an oxide top layer across the T-plug and the oxide isolation layer.

In one example of a method for forming a memory structure, forming the electrical contact further comprises forming the electrical contact on the T-plug through the oxide top layer.

In one example of a method for forming a memory structure, the semiconductor substrate further comprises an array of charge storage devices within the tiered stack of semiconductor layers oriented along the central pillar.

In one example of a method for forming a memory structure, the central pillar is p-type and the T-plug is n-type.

In one example of a method for forming a memory structure, the central pillar and the T-plug are polysilicon.

In one example there is provided, a memory device, comprising:
a contact region;
a source select gate (SGS) layer disposed on the contact region;
a tiered stack of semiconductor layers disposed on the SGS layer;
a drain select gate (SGD) layer disposed on the tiered stack of semiconductor layers;
a nitride isolation layer disposed on the SGD layer;
an oxide isolation layer disposed on the nitride isolation layer;
a central pillar extending from within the contact region to a position along an edge of the nitride isolation layer;
a T-plug disposed on the central pillar and extending to a top surface of the oxide isolation layer, the T-plug further extending across a proximal portion of a top surface of the nitride isolation layer surrounding the central pillar; and
an electrical contact disposed on the T-plug such that the T-plug provides a barrier against electrical shorting from the electrical contact to the SGD layer.

In one example of a memory device, the device further comprises an oxide top layer disposed across the oxide isolation layer and the T-plug, wherein the electrical contact extends through the oxide top layer to the T-plug.

In one example of a memory device, the device further comprises an array of charge storage devices within the tiered stack of semiconductor layers oriented along the central pillar.

In one example of a memory device, the central pillar is p-type and the T-plug is n-type.

In one example of a memory device, the central pillar and the T-plug are polysilicon.

In one example there is provided, a computing system, comprising:

one or more of the memory devices of claim 12, further comprising an array of charge storage devices arranged within the tiered stack of semiconductor layers and oriented along the central pillar;

a plurality of metallization word lines coupled to groups of the charge storage devices across the array;

a plurality of metallization bit lines coupled to groups of charge storage devices across the array, such that each charge storage device is uniquely addressed in the array by a combination of word lines and bit lines; and circuitry electrically coupled to the memory devices and configured to:

generate memory control commands;

address the charge storage devices in the array; and read a state of each charge storage device.

In one example of a computing system, the system further comprises a power source coupled to the circuitry.

In one example of a computing system, the circuitry further comprises I/O circuitry configured to control I/O operations of the memory devices.

In one example of a computing system, the I/O circuitry is configured to communicate with a processor.

In one example of a computing system, the circuitry further comprises:

row circuitry coupled to the word lines; and column circuitry coupled to the bit lines, the column circuitry and the row circuitry being configured to address the plurality of charge storage devices in the array.

In one example of a computing system, the circuitry further comprises read/write circuitry coupled to the row circuitry and the column circuitry and configured to control read and write commands to and from charge storage devices of the array.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device, comprising:

a contact region;

a source select gate (SGS) layer disposed on the contact region;

a tiered stack of semiconductor layers disposed on the SGS layer;

a drain select gate (SGD) layer disposed on the tiered stack of semiconductor layers;

a nitride isolation layer disposed on the SGD layer;

an oxide isolation layer disposed on the nitride isolation layer;

a central pillar extending from within the contact region to a position along an edge of the nitride isolation layer;

a T-plug disposed on the central pillar and extending to a top surface of the oxide isolation layer, the T-plug further extending across a proximal portion of a top surface of the nitride isolation layer surrounding the central pillar; and an electrical contact disposed on the T-plug such that the T-plug protects against electrical shorting from the electrical contact to the SGD layer.

2. The device of claim 1, further comprising an oxide top layer disposed across the oxide isolation layer and the T-plug, wherein the electrical contact extends through the oxide top layer to the T-plug.

3. The device of claim 1, further comprising an array of charge storage devices within the tiered stack of semiconductor layers oriented along the central pillar.

4. The device of claim 1, wherein the central pillar is p-type and the T-plug is n-type.

5. The method of claim 1, wherein the central pillar and the T-plug comprise polysilicon.

6. A computing system, comprising:

one or more of the memory devices of claim 1, further comprising an array of charge storage devices arranged within the tiered stack of semiconductor layers and oriented along the central pillar;

a plurality of metallization word lines coupled to groups of the charge storage devices across the array;

a plurality of metallization bit lines coupled to groups of charge storage devices across the array, such that each charge storage device is uniquely addressed in the array by a combination of word lines and bit lines; and circuitry electrically coupled to the memory devices and configured to:

generate memory control commands;

address the charge storage devices in the array; and read a state of each charge storage device.

7. The system of claim 6, further comprising a power supply coupled to the circuitry.

8. The system of claim 6, wherein the circuitry further comprises I/O circuitry configured to control I/O operations of the memory devices.

9. The system of claim 6, further comprising a processor, wherein the I/O circuitry is configured to communicate with the processor.

10. The system of claim 9, further comprising one or more of:

a network interface communicatively coupled to the processor or a display communicatively coupled to the processor.

11. The system of claim 6, wherein the circuitry further comprises:

row circuitry coupled to the word lines; and column circuitry coupled to the bit lines, the column circuitry and the row circuitry being configured to address the plurality of charge storage devices in the array.

12. The system of claim 6, wherein the circuitry further comprises read/write circuitry coupled to the row circuitry and the column circuitry and configured to control read and write commands to and from charge storage devices of the array.

* * * * *